US 6,667,192 B1

(12) United States Patent
Patrice et al.

(10) Patent No.: US 6,667,192 B1
(45) Date of Patent: Dec. 23, 2003

(54) DEVICE AND METHOD FOR MAKING DEVICES COMPRISING AT LEAST A CHIP FIXED ON A SUPPORT

(75) Inventors: Philippe Patrice, Marseilles (FR); Jean-Christophe Fidalgo, Gemenos (FR); Bernard Calvas, Aubagne (FR)

(73) Assignee: Gemplus, Gemenos (FR)

( * ) Notice: Subject to any disclaimer, the term of this patent is extended or adjusted under 35 U.S.C. 154(b) by 55 days.

(21) Appl. No.: 10/018,090

(22) PCT Filed: May 30, 2000

(86) PCT No.: PCT/FR00/01490
§ 371 (c)(1),
(2), (4) Date: Dec. 14, 2001

(87) PCT Pub. No.: WO00/77729
PCT Pub. Date: Dec. 21, 2000

(30) Foreign Application Priority Data

Jun. 15, 1999  (FR) .............................................. 99 07551

(51) Int. Cl.$^7$ .......................... H01L 21/44; H01L 23/48
(52) U.S. Cl. ....................... 438/123; 119/612; 119/613; 119/106; 119/107; 119/629; 257/737; 257/725; 257/738; 257/778; 257/779; 257/728
(58) Field of Search .................. 438/107, 108, 438/110, 612, 613, 615, 119, 597, 660, 629, 638, 21, 333, 106, 617, 14, 25, 122–124, 116; 257/666, 737, 779, 728, 725, 738, 778

(56) References Cited

U.S. PATENT DOCUMENTS

| 5,401,689 A | * | 3/1995 | Frei et al. ..................... 438/612 |
| 5,795,818 A | * | 8/1998 | Marrs .......................... 438/612 |
| 6,002,550 A | * | 12/1999 | Amemiya et al. ........... 360/104 |
| 6,232,659 B1 | * | 5/2001 | Clayton ....................... 257/724 |

FOREIGN PATENT DOCUMENTS

| DE | 4431606 A | 3/1996 |
| EP | 0810547 A | 12/1997 |
| WO | WO98/02921 | 1/1998 |

* cited by examiner

Primary Examiner—Matthew Smith
Assistant Examiner—Igwe U. Anya
(74) Attorney, Agent, or Firm—Burns, Doane, Swecker & Mathis, L.L.P.

(57) ABSTRACT

A method for mounting, on a support, at least a microcircuit in the form of a chip produced on a very thin semiconductor substrate. An interconnection point is provided at the chip in the form of a bump contact in weldable material. The bump contact has a welding surface in the same plane as at least one of the chip faces. An interconnection pad is provided on the support that is designed to be welded with a corresponding bump contact of the chip. The welding face of each bump contact of the chip is placed opposite each corresponding interconnection pad of the support. Each bump contact of the chip is welded with each corresponding interconnection pad of the support. The method can be applied to a device such as a chip card.

27 Claims, 4 Drawing Sheets

DEVICE AND METHOD FOR MAKING DEVICES COMPRISING AT LEAST A CHIP FIXED ON A SUPPORT

This disclosure is based upon French Application No. 99/07551, filed on Jun. 15, 1999 and International Application No. PCT/FR00/01490, filed May 30, 2000, which was published on Dec. 21, 2000 in a language other than English, the contents of which are incorporated herein by reference.

BACKGROUND OF THE INVENTION

The present invention relates to a device and a method for manufacturing electronic devices containing at least one chip fixed to a support.

In certain fields, including that of smart cards, it is necessary to effect the mounting of a microcircuit or chip on a relatively thin and flexible support. In the case of smart cards, it is necessary on the one hand for the presence of the chip not to cause an excessive thickness beyond a threshold established by international standards (currently fixed at 50 µm) and on the other hand for the mounting of the chip to be sufficiently secure to allow durable use even when the card is subjected to relatively high bending and twisting stresses.

In a conventional manner, the creation of an excessive thickness is avoided by housing the chip in a cavity provided for this purpose in the thickness of the support.

FIG. 1 schematically shows a known example of mounting a chip 6 on a support 2 intended to constitute a smart card. The chip 6 is housed almost entirely in a cavity 3 so that its thickness is included within that of the support 2. The chip 6 has a set of connecting pads 5 on the edges of its surface turned towards the outside of the cavity 3. These pads 5 are connected to respective contacts 7 on the support by wires 9. The contacts 7 can be situated at the bottom of the cavity, or at an intermediate level in a recessed area 11 around the cavity, as in the example illustrated. These contacts 7 are in their turn electrically connected to contact areas 13 intended to allow an ohmic connection with a card reader. These contact areas 13 are housed entirely in the recess 11 so that their thickness is also contained within that of the support 2.

To protect the whole, a coating of protective material 15 is formed, covering the entire area occupied by the cavity 3, the wires 9 and a portion of the internal edges of the contact areas 11.

This conventional technique suffers from several drawbacks. Firstly, the operation consisting in electrically connecting the connecting pads 5 of the chip 6 to the contacts 7 requires the use of very fine and delicate wires 9, thus forming fragile points. Moreover, the operations of soldering these wires 9 requires a significant amount of tooling and a not insignificant amount of time.

Moreover, the formation of the cavity 3 requires a machining step which is both expensive and weakening for the card.

It should also be noted that this technique based on the integration of a chip in a cavity in a support is difficult to use when it is necessary to connect together several components, for example several chips or other passive or active elements on the same support.

In addition, it is important to design methods which are compatible with automated tooling for mass production, allowing high rates of attaching and welding chips.

SUMMARY OF THE INVENTION

In the light of these problems, the present invention proposes a method for mounting at least one microcircuit in the form of a chip on a support, characterised in that it includes, for the chip or chips, the following steps:

a) providing a chip produced as a very thin semiconductor having at least one interconnection point in the form of a contact pad made from weldable material, said pad having a welding face substantially in the same plane as at least one of the faces of the said chip;

b) providing, at the support, at least one interconnection area intended to be welded with a corresponding contact pad on the chip;

c) placing the welding face of the contact pad or pads on the said chip opposite the corresponding interconnection area or areas on the support; and d) welding the contact pad or pads on the said chip with the corresponding interconnection area or areas on the support.

The present invention advantageously uses the technology of chips produced in a very thin substrate, as described notably in the patent document WO-A-9802921 in the name of Kopin. This technology notably makes it possible to dispose chips having a thickness of 10 microns, or even very substantially less than this thickness.

Advantageously, the interconnection area of the support is produced on a portion of a surface of a face of the support situated in the general plane of this face. In other words, no cavity or recess is created for accommodating the thickness of this interconnection area. Because of this, the interconnection area and also the chip project with respect to the overall plane of the face on which they are situated. This arrangement is possible, by virtue of the invention, because a chip especially configured according to the definition in paragraph a) above is provided.

Preferably the contact pad or pads are produced in aluminium.

Likewise, it is also possible to produce the interconnection area or areas in aluminium.

The method according to the invention lends itself notably to welding by thermocompression or ultrasound.

According to a first embodiment of the invention, the contact pad or pads of the chip pass through the thickness of the chip so as to have a surface accessible on each of the faces of the chip.

This arrangement notably makes it possible to perform the welding step by transmission of energy through the pad or pads in the direction of the thickness of the chip. In other words, the energy for the welding is applied to the face of the contact pad situated opposite to the welding face.

According to one advantageous aspect of this embodiment, a protective substrate which holds the chip is also provided at step a). The welding step can then be performed after the removal of this substrate from the chip.

According to a second embodiment of the invention, a protective substrate with a first face which holds a set of chips is also provided at step a).

Before the welding step, cuts are made around at least one chip on the protective substrate, with a depth of cut which reaches at least the first face of the substrate. After the welding step, the support with its welded chip or chips is separated from the protective substrate. The fact that the cuts have previously been made around the chip makes it possible to remove it in its cut form. It is then possible to perform the aforementioned cuts in the form of notches which pass only partially through the thickness of the protective substrate. In this case, the substrate for all the chips on a wafer remains whole, which facilitates the removal of the chips after welding.

Advantageously, according to this second embodiment, at least when the support is separated, the protective substrate is held so as to enable the chip to be removed by peeling when the support is separated.

The substrate can be held by the interposing of an adhesive layer between a second face thereof, opposite to the first, and a base.

According to a variant of this second embodiment, the depth of cut completely passes through the protective substrate. This arrangement is possible when the protective substrate can be fixed firmly to its base, for example by means of the aforementioned adhesive layer.

The present invention also relates to a device, such as a smart card, having at least one microcircuit in the form of a chip mounted on a support and connected to at least one interconnection area for the support, characterised in that the chip or chips have at least one contact pad having a surface for contact with a corresponding contact area on the support, the contact surface being, at one face of the chip, opposite the contact area.

Advantageously, the contact surface of the contact pad is substantially on the same plane as the face of the chip opposite the said interconnection area.

Preferably, the interconnection area of the support is produced on a portion of a surface of a face of the support which is situated in the overall plane of this face.

The contact pad or pads can be produced from aluminium.

According to a first embodiment of the device, the contact pad or pads pass through the thickness of the chip.

Advantageously the chip has an excess thickness relative to the overall plane of the face of the support on which it is attached equal to or less than 50 microns.

BRIEF DESCRIPTION OF THE DRAWINGS

The invention will be better understood and its advantages will emerge more clearly from a reading of a preferred embodiment, given purely by way of non-limitative examples, with reference to the accompanying drawings, in which.

DESCRIPTION OF THE INVENTION

Figure 1:
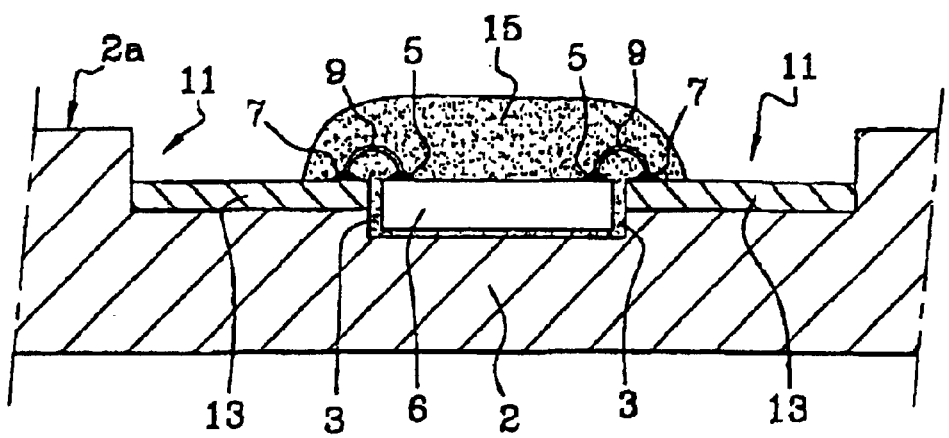
FIG. 1, already described, is a view in section of a known smart card showing the location of a chip in a cavity in the support.
Figure 2:
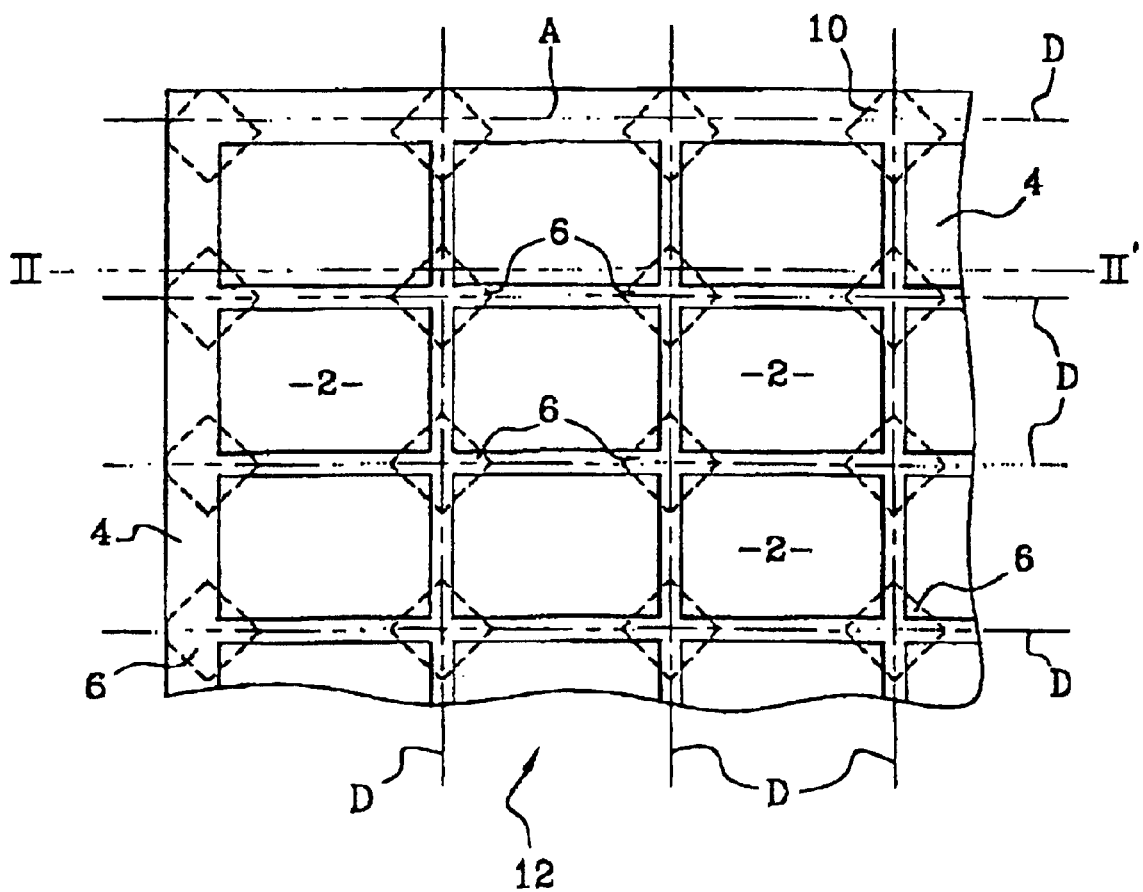
FIG. 2 is a partial plan view of a wafer resulting from the so-called silicon on insulator technology used in the embodiments of the invention.

FIG. 2 is a view which shows a wafer 12 resulting from the so-called silicon on insulator (SOI) technology. This technology makes it possible to produce chips 2—that is to say the active part of the microcircuit—which are very thin.

The SOI technology for obtaining chips with such dimensional characteristics is described notably in the patent document WO-A-98 02921 in the name of Kopin. Thus the manufacturing details will not be repeated for reasons of conciseness.

The chips 2 are disposed in lines of rows on an insulating protective substrate 4, typically glass, which constitutes the body of the wafer. This insulating substrate 4 serves amongst other things to protect the chips 2, which are flexible because of their thinness (around 10 microns).

Each chip 2 is held on the protective glass substrate 4 by adhesive pads 6. These adhesive pads 6 consist of small rectangular areas, turned through 45° with respect to the sides of the chips 2 and placed on the respective corners of each chip, so that, apart from the periphery of the wafer 12, a pad 6 covers four joined corners of four different chips.

Figure 3:
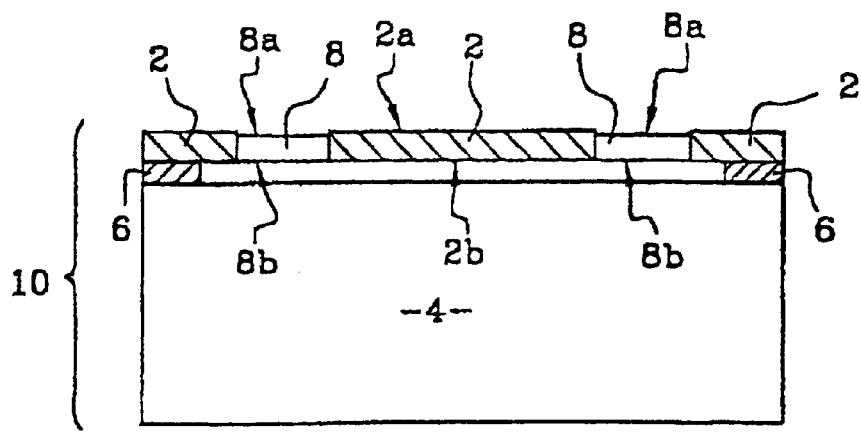
FIG. 3 is a view in section of an assembly composed of a very thin chip, a protective substrate and adhesive pads according to the so-called silicon on insulator technology.

FIG. 3 shows an assembly 10 after cutting of the wafer 12 into elementary surfaces each comprising a chip 2. The assembly 10 thus comprises the chip itself 2, its protective substrate 4 to the dimensions of the chip and the adhesive pads 6 holding the chip on the substrate by its corners.

The chip 2 is provided with interconnection pads 8 which make it possible to communicate between the circuit which it contains and the external environment of the circuit, notably with regard to input and output signals and a supply voltage.

These pads 8 are produced by areas of conductive material, in this case aluminium. Because of the great thinness of the chip 2—its thickness does not exceed 100 microns and is in the example around 5 microns—it is possible to produce the interconnection pads so that they have a contact surface on each face 2a and 2b of the chip 2. In other words, each interconnection pad passes through the thickness of the chip 2, as shown in FIG. 3.

In the example illustrated, the contact faces 8a and 8b of the interconnection pads are substantially flush with the respective faces 2a and 2b of the chip 2. However, these contact faces 8a and 8b can be slightly recessed or projecting vis-à-vis these respective faces 2a and 2b whilst being considered to be substantially on the overall plane of the corresponding face 2a, 2b of the chip. These connection pads are distinguished from those known in the form of protrusions (also referred to as "bumps" in English terminology) which have an appreciable protuberance vis-à-vis the plane of the chip, this protuberance being precisely used to create the interconnection.

The protective substrate 4 and the adhesive pads 6 serve essentially to protect the chip during manufacture and handling before the chip is attached to its final support.

Figure 4:
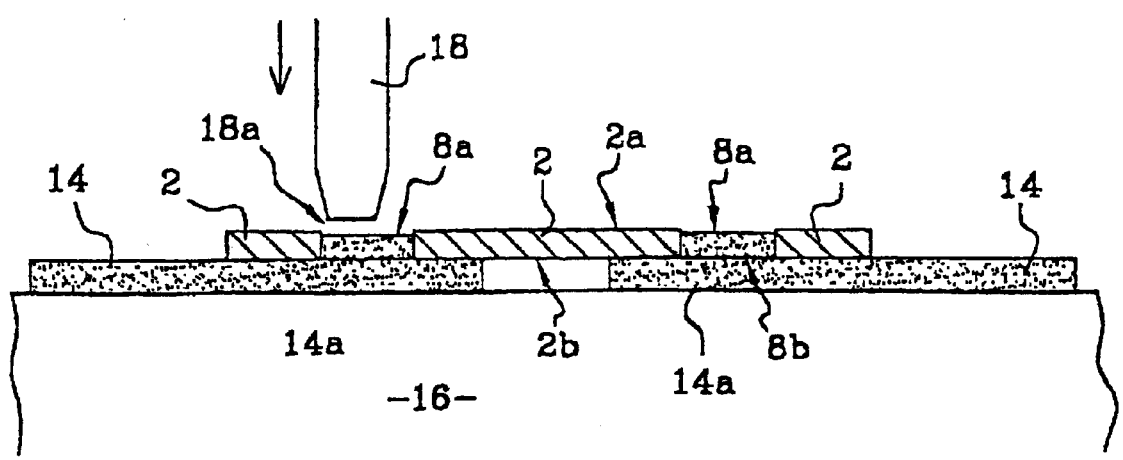
FIG. 4 is a schematic view in section showing the operation of attaching the chip illustrated in FIG. 3 on its support according to a first embodiment of the invention.

FIG. 4 shows a step of attaching a chip 2 after the removal of the protective substrate 4 and the adhesive pads 6, according to a first embodiment of the invention. In this first embodiment, the removal of the protective substrate takes place through an operation of peeling off the latter before the step of final fixing of the chip.

The bare chip 2 is then attached to its communication interface 14 produced at the surface of its support 16. This communication interface 4 can, according to the applications envisaged, serve to:

connect inputs and outputs of the chip with the outside, notably the contact card readers; and/or provide the necessary interconnections between the chip and the elements produced at the support. These elements can be an antenna integrated into the support 2 so as to constitute a so-called "contactless card", known per se, other circuit elements integrated into the card (for example one or more other chips), or an electric supply source.

In the embodiment, the communication interface 14 is produced by metallisations intended to provide different electrical connections between the chip and the elements associated with the support 16. These metallisations converge towards the location of the support intended to receive the chip 2 whilst having connection areas 14a. Each connection area 14a of the communication interface is situated vertically in line with a respective contact pad 8 on the chip 2. At least the part of the communication interface which comprises the connection areas 14a is produced from aluminium.

Once the chip is positioned vis-à-vis the connection areas 14a, a welding is effected in order to connect the latter with the respective pads 8 on the chip. It should be noted that the contact pads 8 are through pads; the chip can be attached to its support 16 with one or other of its faces 2a or 2b turned towards the latter. In the example, the faces 8b of the contact pads are opposite the connection areas 14a.

The welding is carried out by means of a thermocompression tool which supplies a pressure to the face 8a of the contact pad opposite to the one 8b turned towards the connection area 14a. To this end, the thermocompression tool has a welding head 18a with a cross-section substantially equal to or less than the surface of the contact pad 8, intended to come against the surface 8a of the latter and press the pad against its corresponding connection area 14a. At the same time, the tool 18 supplies heat energy by generating vibrations through the pad 8. This energy raises the temperature at the contact point and generates the fusion of the contact pad 8 with its connection area 14a. It should be noted that these two connection elements 8 and 14a, both being made from aluminium, are perfectly compatible with this thermocompression technique.

The thermocompression technique is well-known per se and will not be detailed here for reasons of conciseness.

In a variant, it can also be envisaged effecting the welding of the connection points 8 and 14a by ultrasound or laser beam according to techniques known per se. In these cases also, the welding energy can be applied to the face 8a of the pad 8 opposite to the one 8b in contact with the connection area and thus pass through the thickness of the pad.

Naturally, it is possible to envisage producing the contact pads 8 and/or the connection areas in other metals or alloys provided that they are compatible with the manufacturing techniques and welding used.

The use of contact pads 8 which are substantially without relief with respect to the respective faces 2a and 2b of the substrate, that is to say without a protrusion, makes it possible notably to effect automated welding according to the technique known by the English term "bumpless tape automatic bonding" or "bumpless TAB". This technique makes it possible to effect welding at very high rates by mounting the chips 2 on a tape which is made to pass in front of the welding tool 18, the support 16 also being passed in synchronism with the welding rate.

A second embodiment of the invention will now be described with reference to FIG. 5, for also welding very thin chips provided with bumpless contact pads. These chips have to a great extent the same characteristics as those described in the first embodiment. Thus only the differences will be described here for reasons of conciseness.

Figure 5A:
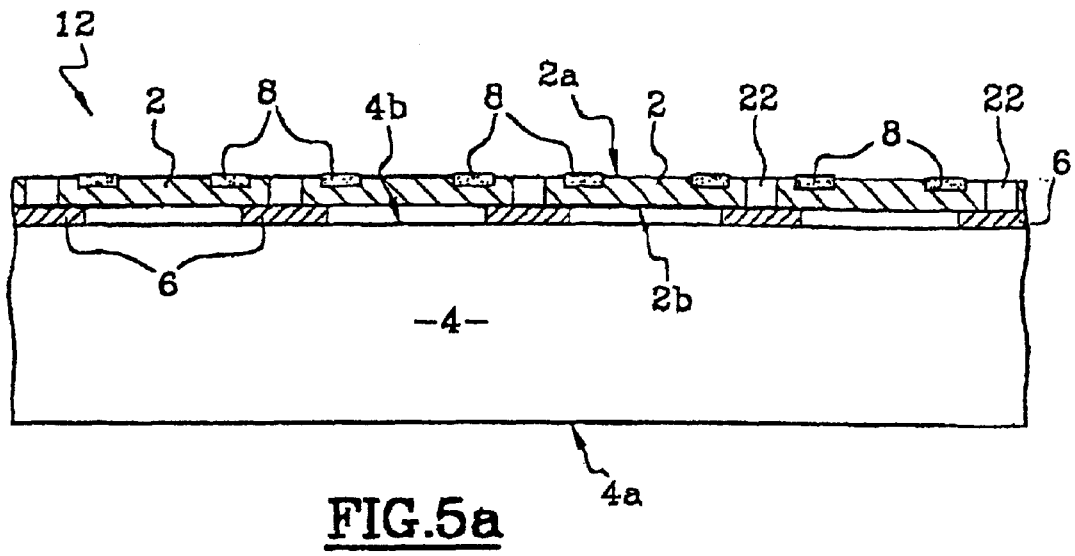
FIGS. 5a to 5c are schematic views in section showing successive operations of preparing a wafer containing very thin chips produced according to the so-called silicon on insulator technology and of attaching these chips to a support according to a second embodiment of the invention.
Figure 5B:
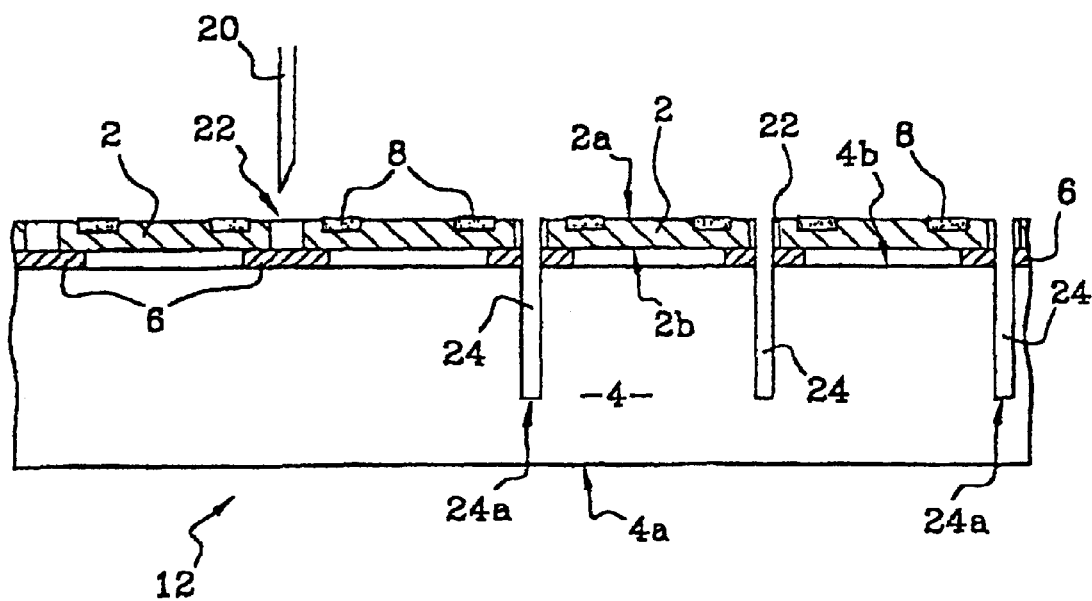

As shown by FIG. 5a, the chips 2 are provided with connection pads 8 which have only one contact surface, present on the face 2a turned towards the outside vis-à-vis the protective glass substrate 4. As with the first embodiment, these contact pads have substantially no relief relative to the face 2a on which they are present, being produced according to the so-called "bumpless" technology to use the English term. In the example, the pads 8 are also produced from aluminium, although other electrically conductive materials can be envisaged according to compatibility with the welding technique provided.

According to the second embodiment, a cutting of the assembly 10 including the chip 2, the adhesive pads 6 and part of the thickness of the substrate 4 is effected. This partial cutting is carried out by means of a cutting tool 20, such as a rotary blade, which forms, at each space 22 separating two adjacent chips 2, a notch 24 perpendicular to the overall plane of the wafer 12. Each notch 24 passes through an adhesive pad 6 (and possibly a portion of the unused edge of the chip 2) and a part of the protective glass substrate 4. The termination point 24a of each notch is not critical, provided that it is situated at least below the level of the bottom surface 2b of the chips and above the face 4a of the substrate opposite to the one 4b opposite the chips 2.

It should be noted that the notches 24 are formed on a grid which divides the chips 2 into lines and rows on the wafer 12 (FIG. 2). Thus each of the four edges of a chip 2 is surrounded by a notch 24.

Figure 5C:
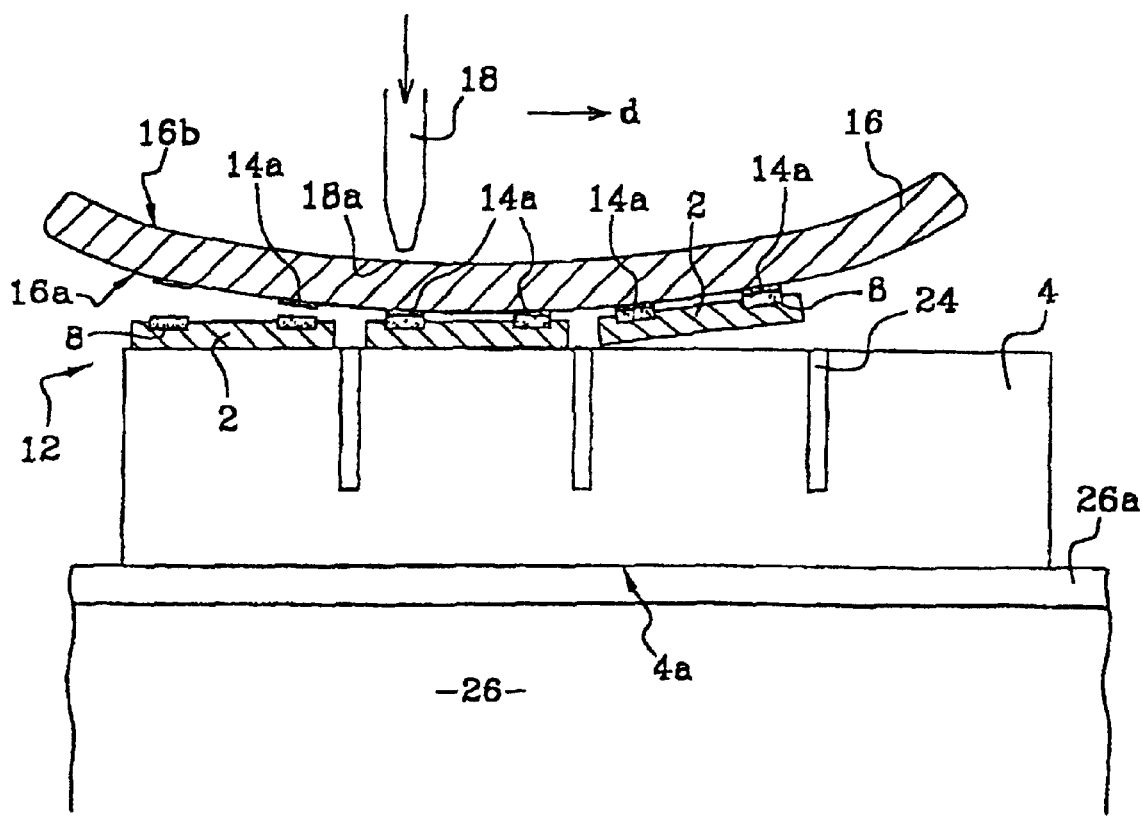

Once the notches 24 have been made, the face 4a of the wafer 12 is placed on a platform 26 so that the wafer is held thereon fixedly. This fixing can be obtained by mechanical means of fixing the wafer and/or by the interposing of an adhesive between the platform 26 and the face 4a of the glass substrate 4. By way of example, the platform 26 can be provided on its top face (which receives the wafer 12) with an adhesive film 26a (FIG. 5c). The assembly including the wafer 12 with the notches 24 is then ready for an operation of attaching the chips to the support for which the chips are intended (film, card, printed circuit, grid, etc).

In the example, the support 16 is the same as for the case of the first embodiment. As shown in FIG. 5c, this support also has metallisations formed on the surface, the ends of which converge in order to form connection areas 14a in aluminium or another material compatible with the welding technique used, each connection area being intended to be connected with a corresponding pad 8 on the chip 2.

The support 16 as shown is in the form of a continuous strip which will be cut into individual devices (for example smart cards) once the welding operation has ended.

In order to effect the welding between the pads 8 on the chips 2 and the corresponding connection areas 12 on the supports, use is made of a thermocompression tool 18 as described previously in the context of the first embodiment.

Each pad 8 on a chip 2 is matched with its corresponding connection area 14a under the head 18a of the thermocompression tool. This arrangement is obtained by running under it the strip forming the support 16 in the direction of the arrow d and the correlated movement of the platform 26 holding the wafer 12. The head 18a of the thermocompression tool 18 is situated just above the face 16b of the support opposite to the one 16a intended to receive a chip 2.

As shown in FIG. 5c, the strip forming the support 16 follows a curved path and stands proud of the wafer 12 at the point where the latter is situated at a tangent, vertically in line with the thermocompression tool. At this point, a pad 8 on the chip is situated opposite the corresponding connection area 14a formed on the support 16. The thermocompression tool 18 then performs the welding of the pad 8 with the connection area 14a by applying energy through the thickness of the support 16 and the pad 8.

For each chip 2 thus welded to its support, the path of the strip moves it away from its protective substrate 4. There is thus created a force of pulling away or cleaving the chip 2 from its protective substrate 4. The latter, because it is held on its platform, enables the chip to be disconnected from the adhesive pads 6 when it is moved away from the substrate. This is because the adhesion between the pads 8 and the connection areas 14a is substantially higher than the adhesive pads 6. Likewise, the adhesion of the adhesive pads 6 is substantially less than the breaking strength of the substrate 4, even when weakened by the notches 24. It should be noted that, when the chip 2 is disconnected from its protective substrate 4, the adhesive pads 6 remain on the latter.

It will be understood that the notches 24 serve essentially to separate the edges around each chip 2. The fact that they partially breach the thickness of the protective substrate 4 does not play a decisive role in the welding process which has just been described. This is because the thickness of the protective substrate 4 is partially breached only because the current cutting techniques do not make it possible to exactly limit the depth of the cut to the thickness of the chip, which can be substantially less than 10 microns. Thus the notch in the thickness of the substrate is due to the tolerance in the precision of the cutting tool 20.

According to a variant of the second embodiment, the wafer 12 is cut completely at the locations of the notches 24, so that each portion of protective substrate 4 around a chip 2 is mechanically disconnected from the remainder of the wafer 12. The assembly thus cut is maintained in its configuration before cutting by the adhesive film 26a. In this variant, the cleaving force occasioned by the removal of the support 16 with the welded chips 2 is entirely countered, at the protective substrate 4, by the adhesive force of the film 26a.

Naturally, the second embodiment and its variant also make it possible to use other welding techniques, such as ultrasonic welding, laser beam welding, etc.

For the first and second embodiments, it is possible to provide a subsequent step of deposition of a protective layer on at least the exposed parts of the chip or chips on their support. This deposition can be effected by attaching a fine film or by spraying a lacquer.

Naturally, the scope of the present invention extends to all applications requiring an attachment of a very thin chip on a surface of a support, this being able to be not only flexible (film, sheet, plastic card, etc) but also rigid.

What is claimed is:

1. A method for manufacturing an electronic device having at least one chip and a support, comprising the steps of:
   providing a thin chip having a thickness which does not exceed 100 $\mu$m and at least one contact pad made from a weldable material that is substantially flush with at least one face of said chip;
   providing a support with at least one communication interface having at least one interconnection area protruding in its overall plane;
   placing said one face of the chip against the surface of the support so that the contact pad comes into direct contact with the communication interface; and
   welding the contact pad with the corresponding communication interface of the support, by applying welding energy through the thickness of the support and/or through the pad.

2. A method according to claim 1 wherein the contact pad passes through the thickness of the chip in order to present a welding surface on each of two opposite faces of the chip, and the chip is welded to the interconnection area by applying welding energy through the thickness of the pad.

3. A method according to claim 1 wherein the welding step is carried out by thermocompression, ultrasound or laser beam, through the thickness of the pad.

4. A method according to claim 1 wherein the support is made from a material compatible with the technique used for welding, and the welding step is effected by thermocompression, ultrasound or laser beam, through the thickness of the support.

5. A method according to claim 1 wherein the chip has a thickness of about 5 $\mu$m.

6. A method according to claim 1, wherein said chip is disposed on a protective substrate.

7. A method according to claim 6, further including the step of removing the substrate prior to the step of welding.

8. A method according to claim 6, wherein the placing step and the welding step are effected before a step of removal of the substrate.

9. A method according to claim 6, wherein the protective substrate has a first face which holds a set of chips; and
   before the welding step notches are cut in the protective substrate around the chip, a point of termination of the depth of the notch in the substrate being situated at least below the level of a bottom face of the chip.

10. A method according to claim 9 wherein, after the welding step, the support with its welded chip is separated from the protective substrate.

11. A method according to claim 9 wherein, before the welding step, the support with the set of chips is separated from the protective substrate.

12. A method according to claim 9 wherein the protective substrate is held so as to allow the removal of the chip by peeling off.

13. A method according to claim 9 wherein the notches pass completely through the thickness of the protective substrate.

14. A method according to claim 9 further including a step subsequent to that of welding of removing the protective substrate and depositing a thin protective layer on at least the exposed parts of the chip and its support.

15. A method according to claim 9, wherein said notches terminate at a depth that is above a face of the substrate which is opposite to the face on which said chip is disposed.

16. The method of claim 1, wherein said electronic device is a smart card, and said communication interface comprises a contact for connecting input and/or output signals of the chip with a card reader.

17. The method of claim 1, wherein said electronic device is a contactless smart device, and said communication interface comprises an antenna.

18. The method of claim 17, wherein said smart device is a smart card.

19. An electronic device in the form of a smart card, having at least one chip and a support, said chip having at least one contact pad made from weldable material; the support having at least one communication interface welded to the contact pad which is in direct contact with the communication interface, wherein the chip has a thickness between its faces that does not exceed 100 $\mu$m and is attached to the communication interface vertically in line with the contact pad; and
   the support has at least one interconnection area projecting in its overall plane without any cavity or recess for accommodating this area.

20. A device according to claim 19, wherein the support is made from a material compatible with the application of welding energy through the thickness of said support.

21. A device according to claim 20, wherein the welding surface of the contact pad is substantially on the same plane as the face of the chip adjacent the interconnection area.

22. A device according to claim 19 wherein the chip has a thickness equal to or less than 50 $\mu$m.

23. A device according to claim 19 wherein the interconnection area is connected to at least one element of the input and output interface with a contact reader and/or antenna reader, on the surface of the support.

24. A device according to claim 19, wherein the contact passes through the thickness of the chip to present a welding surface on each of two opposite faces of the chip.

25. A device according to claim 19 wherein the chip has a thickness of about 5 $\mu$m.

26. The device according to claim 19, wherein said communication interface comprises a contact for connecting input and/or output signals of the chip with a card reader.

27. The device according to claim 19, wherein said smart card is a contactless card, and said communication interface comprises an antenna.

* * * * *